US006322042B1

United States Patent
Nemec

(12) United States Patent
(10) Patent No.: US 6,322,042 B1
(45) Date of Patent: Nov. 27, 2001

(54) EXTRACTED AND POSITIONING DEVICE OF A FAN

(75) Inventor: Frederick James Nemec, Tustin, CA (US)

(73) Assignee: Lite-On Enclosure Inc., Taipei (TW)

( * ) Notice: Subject to any disclaimer, the term of this patent is extended or adjusted under 35 U.S.C. 154(b) by 0 days.

(21) Appl. No.: 09/619,438

(22) Filed: Jul. 19, 2000

(51) Int. Cl.$^7$ ..................................... A47G 29/00
(52) U.S. Cl. .................. 248/694; 361/695; 361/687; 361/825; 417/423.15
(58) Field of Search ............... 248/223.41, 694; 361/687, 694, 695, 825; 417/360, 423.15; 416/244 R; 312/223.2, 223.1

(56) References Cited

U.S. PATENT DOCUMENTS

| | | | |
|---|---|---|---|
| 4,356,531 | * 10/1982 | Marino et al. ................. | 361/683 |
| 4,739,445 | * 4/1988 | Tragen ........................... | 361/695 |
| 4,931,904 | * 6/1990 | Yiu ................................ | 361/695 |
| 5,287,009 | * 2/1994 | Heung ........................... | 307/141 |
| 5,680,295 | * 10/1997 | Le et al. ........................ | 361/695 |
| 5,967,633 | * 10/1999 | Jung .............................. | 312/223.2 |
| 6,002,586 | * 12/1999 | Chen et al. .................... | 361/695 |
| 6,061,237 | * 5/2000 | Sands et al. ................... | 361/695 |
| 6,075,698 | * 6/2000 | Hogan et al. .................. | 361/695 |
| 6,088,224 | * 7/2000 | Gallagher et al. ............. | 361/695 |
| 6,115,250 | * 9/2000 | Schmitt ......................... | 361/695 |
| 6,244,953 | * 6/2001 | Dugan et al. .................. | 454/184 |

FOREIGN PATENT DOCUMENTS

20013164 U1 * 11/2000 (DE).

* cited by examiner

Primary Examiner—Leslie A. Braun
Assistant Examiner—Holly N. Sy
(74) Attorney, Agent, or Firm—Rosenberg, Klein & Lee

(57) ABSTRACT

An extracted and positioning device of a fan is suitable to be used in industrial computers. A frame of a computer casing is installed with at least one fan fixing frame; the fixing frame is a frame body; each of two sides of the frame body is disposed with a lateral plate; the inner surface of each lateral plate has inward flanges; a rear end of the of the lateral plate is connected to a rear plate; a front bottom plate is connected in front of the lateral plate; a buckle with an elastic press is transversely and forwards protruded from the front bottom plate; further, a slidable frame plate is formed and is engagable with the fixing frame; the slidable frame plate has a 日 (a Chinese word) shape; the slidable frame plate is slidable with two protrusions of the frame body; a front end of the frame plate has a pull with a through hole; a concave portion is at a middle portion of the front end of the pull, thereby, as the frame plate slides into the frame body, it can be positioned by the buckle; each of the four corners of the frame plate is connected to a fan; the fan slides on the fixing frame with the frame plate.

2 Claims, 4 Drawing Sheets

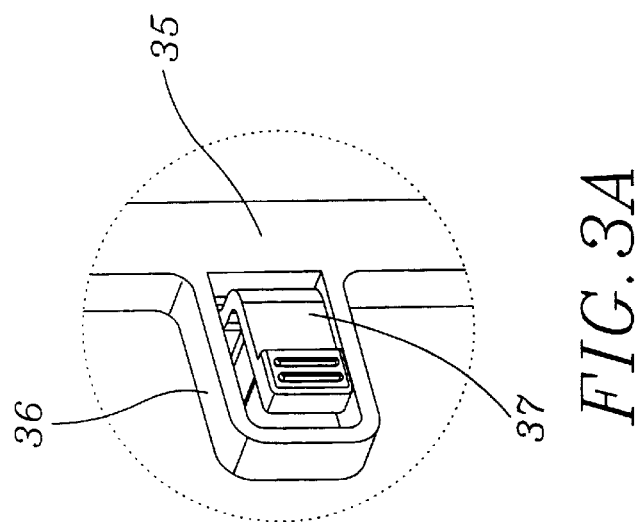
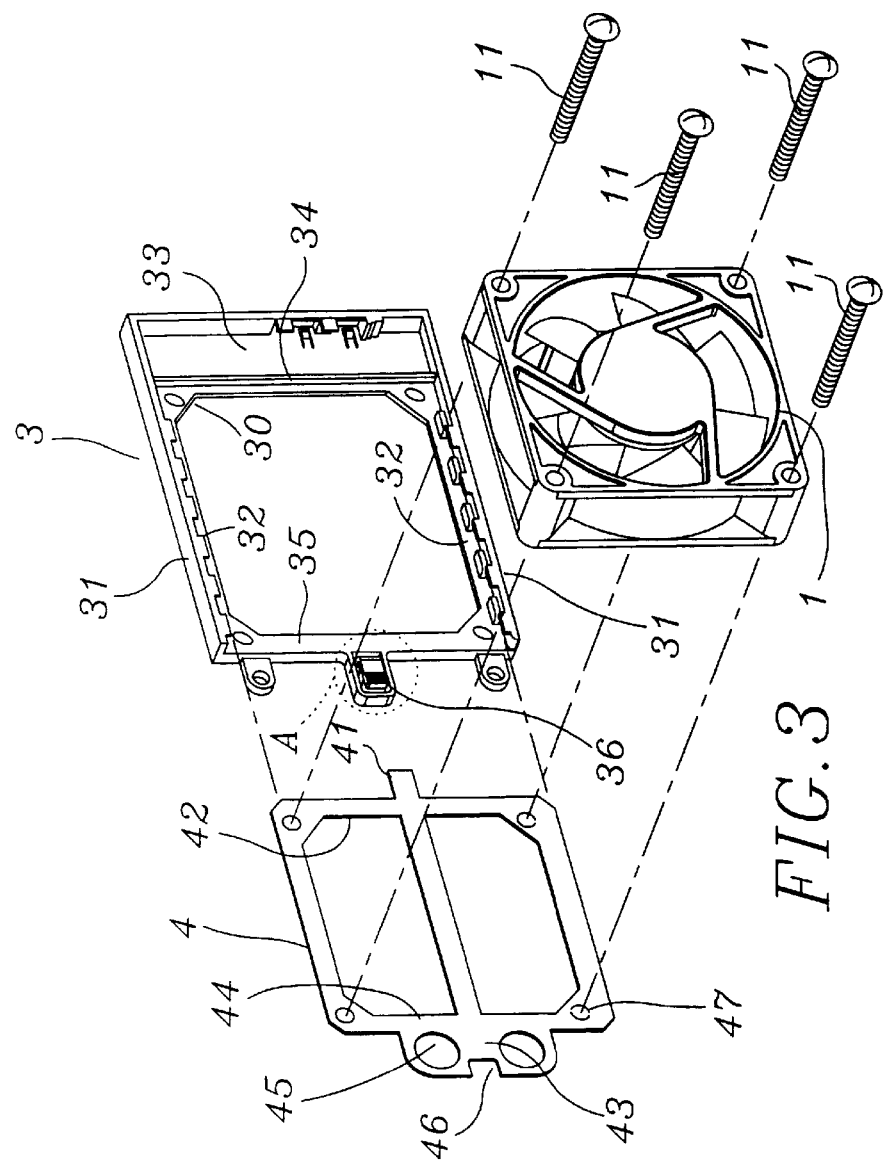

EXTRACTED AND POSITIONING DEVICE OF A FAN

FIELD OF THE INVENTION

The present invention is related to an extracted and positioning device of a fan, and especially to a structure by which the fan can be extracted from or positioned in a computer.

BACKGROUND OF THE INVENTION

As shown in FIG. 5, a prior art fan is shown. The fan 1 is directly positioned and fixed to a casing 2 of a computer. In a more original way, the fan 1 is installed at a position of a power source. The fan 1 is primarily used to dissipate heat of a computer. Even the central processing unit has a dedicated fan. The function of the fan serves to transfer the heat generated in the computer case to outer environment for reducing temperature in the computer case so that the mother board and interface board in the computer casing has a preferred operational environment. Even in an air conditioned room, the computer remains to dissipate heat, otherwise the heat will accumulated in the computer casing so that the temperature within the casing will increase. This is disadvantageous for the operation of a computer. The chips in an electronic device is more necessary to dissipate heat. If the temperature is too high, the operations and signal transformation will be unsteady, some problems will occur. This is possible to affect the operation speed of the computer. Even the computer possibly shuts down. This has a bad effect to the use of information. Therefore, it is a basic demand for a computer to dissipate heat normally and uninterrupted so that the components can be used efficiently. This is especially important for industrial computers.

SUMMARY OF THE INVENTION

Accordingly, the primary object of the present invention is to provide an extracted and positioning device of a fan. Thereby, a fan in a prior art which is fixed to a single position can be used in a long period operational industrial computer. In order to meet the requirement of sufficient heat dissipation, no tripping, no shutting down, in general, a plurality of fans are installed in an industrial computer for dissipating heat. In order for the computer to be used successfully, it can not be shut down in operation. In a general computer, it is impossible to update components without shutting down. Currently, only part of extractable hard disk is possible. Thus, there is a further demand for a novel design in which the fans of a computer can be updated or added without shutting down. This is the primary object of the present invention.

Therefore, the present invention provides an extracted and positioning device of a fan suitable to be used in industrial computers. A frame of a computer casing is installed with at least one fan fixing frame; the fixing frame is a frame body; each of two sides of the frame body is disposed with a lateral plate; the inner surface of each lateral plate has inward flanges; a rear end of the of the lateral plate is connected to a rear plate; a front bottom plate is connected in front of the lateral plate; a buckle with an elastic press is transversely and forwards protruded from the front bottom plate; further, a slidable frame plate is formed and is engagable with the fixing frame; the slidable frame plate has a 日 (a Chinese word) shape; the slidable frame plate is slidable with two protrusion of the frame body; a front end of the frame plate has a pull with a through hole; a concave portion is at a middle portion of the front end of the pull, thereby, as the frame plate slides into the frame body, it can be positioned by the buckle; each of the four corners of the frame plate is connected to a fan; the fan slides on the fixing frame with the frame plate.

The various objects and advantages of the present invention will be more readily understood from the following detailed description when read in conjunction with the appended drawing.

BRIEF DESCRIPTION OF THE DRAWINGS

FIG. 3 exploded perspective view of the present invention.

FIG. 3A partial enlarged view of the A part in FIG. 3.

DETAILED DESCRIPTION OF THE PREFERRED EMBODIMENTS

Figure 1:
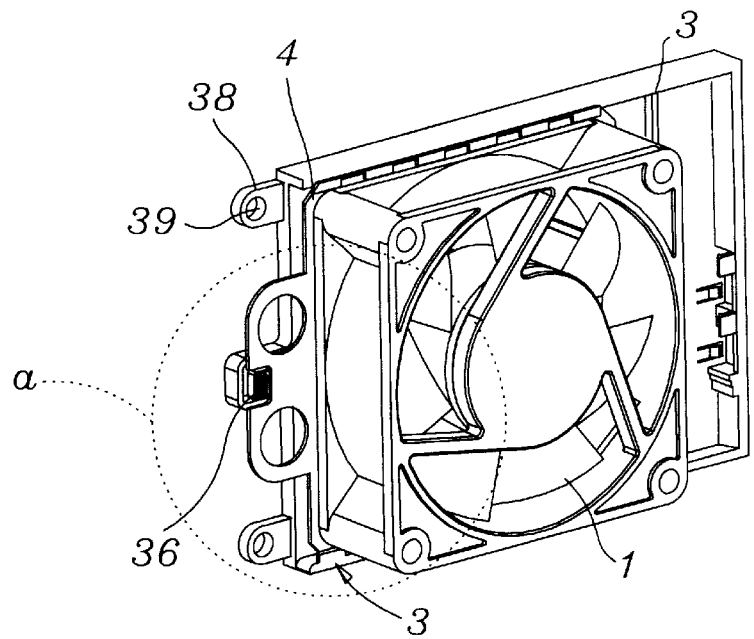
FIG. 1 is pective view of the present invention.
Figure 2:
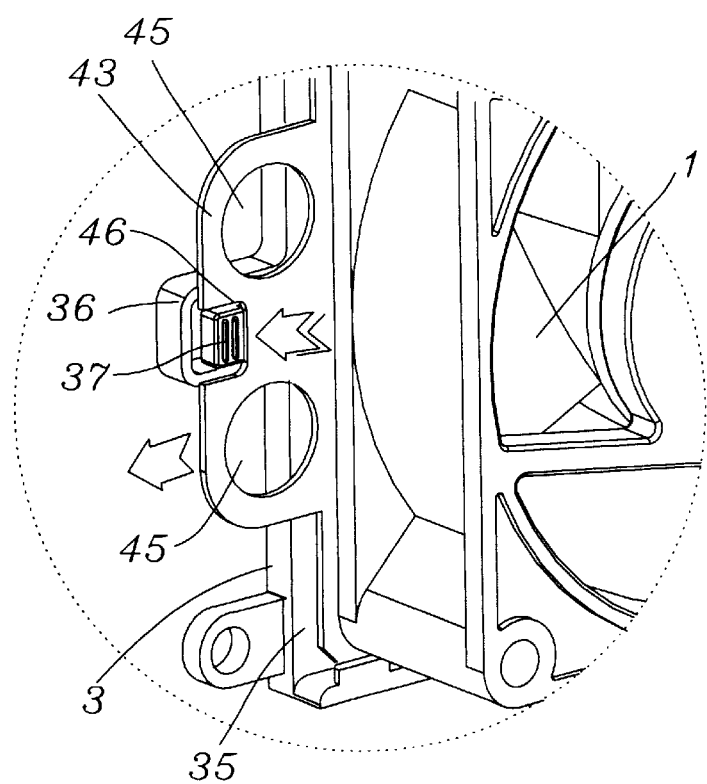
FIG. 2 is an enlarged view of "a" part in FIG. 1 of the present invention
Figure 4:
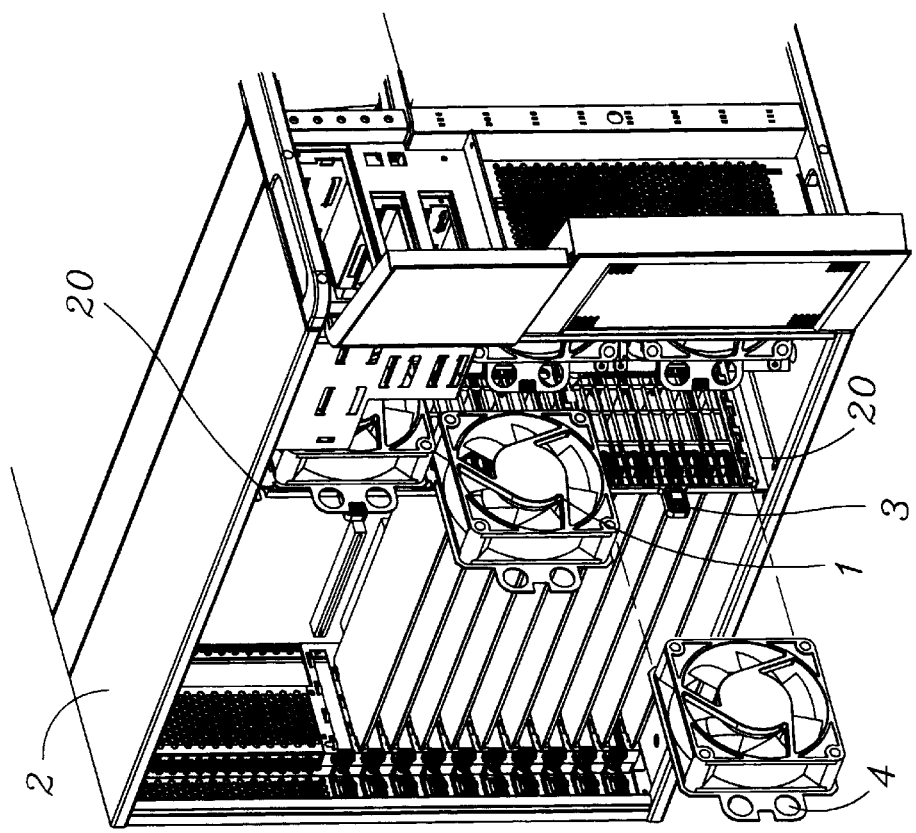
FIG. 4 shows an embodiment of the present invention.
Figure 5:
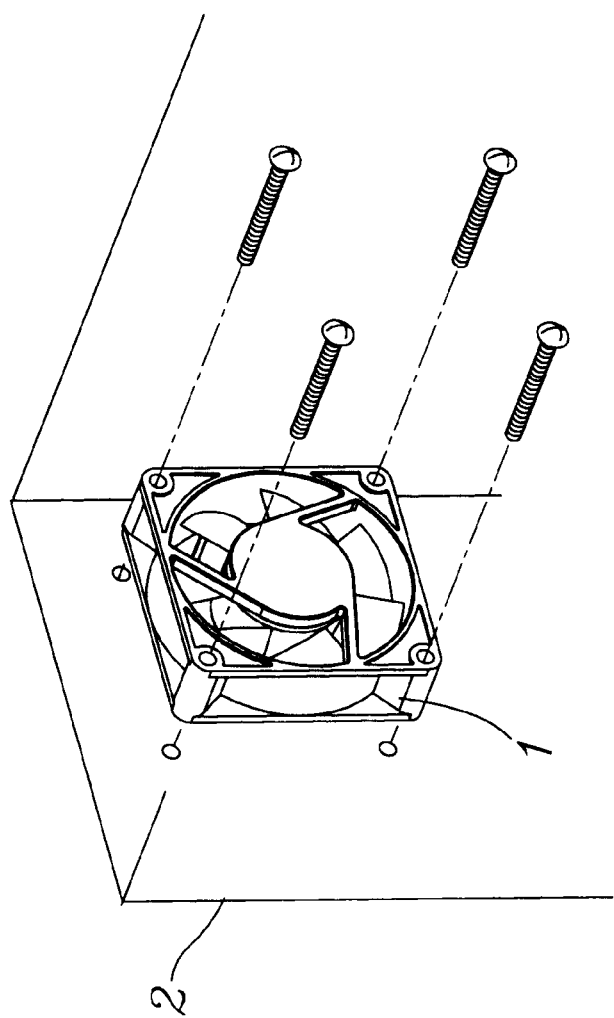
FIG. 5 is an exploded perspective view of a prior art.

With reference to FIGS. 1 to 4, the extracted and positioning device of a fan according to the present invention is illustrated herein, which is mainly used in industrial computers. In the present invention, a frame 20 of a computer casing 2 is installed with at least one fan fixing frame 3. The fixing frame is a frame body 30. Two sides of the frame body 30 are disposed with lateral plates 31. The inner surface of each lateral plate 31 has inward flanges 32. The rear end of the lateral plate 31 is connected to a rear plate 33. A joint 34 for connecting a power source is installed at the rear plate 33. A front bottom plate 35 is connected in front of the lateral plate 31. A buckle 36 with an elastic press is transversely and forwards protruded from the front bottom plate 35. Another, a slidable frame plate 4 is formed and is engagable with the fixing frame 3. The slidable frame plate 4 has a 日 (a Chinese word) shape. The rear end 42 of the frame plate 4 has a protrusion 41. The joint of the protrusion 41 is connected to the joint 34 connected to a power source for conducting with a power source. The slidable frame plate 4 is slidable with the inner surfaces of the inward flangers 32 of the frame body 30. The front end 44 of the frame plate 4 has a forwards protruded pull 43 with a through hole 45. A concave portion 46 is at a middle portion of the front end 44 of the pull 43, thereby, as the frame plate 4 slides into the frame body 30, it can be positioned by the buckle 36. Each of the four corners of the frame plate 4 is connected to a fan 1. The fan 1 is fixed to the screw holes 47 of the frame plate 4 by four screws 11, and power is provided to the fan 1 through the wires on the frame plate 4 so that the fan 1 slides on the fixing frame 3 with the frame plate 4. Each of two sides of the frame body 30 of the fixing frame 3 has an ear piece 38 having a hole 39 therein, which is threadedly fixed to the frame 20 through the hole 39.

Accordingly, in the present invention, since the fan is fixed to the frame plate, which is installed on the frame body of the fixing frame as a drawer. Thus, the fan can be extracted or pushed in a predetermined direction as that shown in FIG. 4. However, the aforesaid embodiment is used to describes the present invention but not to confine the present invention. Furthermore, conductive wires are installed on the frame plate 4 for saving the required electric wire and meeting the demand of extractability in order that as the fan is extracted, the fan still rotates so as to effect the safety of the user. Therefore, the power joint of the present invention is insertable. Matching with the structures of the protrusion 41 of the frame body, it can be inserted for conduction and extracted for interruption easily. Moreover, the fan is necessary to position as it is used. The concave portion 46 with the buckle 36 serves to achieve the function of positioning. As shown in FIG. 3A, the buckle 36 has an elastic piece 37 at a protruding frame for buckling with the concave portion 46. Now, a finger is used to hook through the through hole 45 of the pull 43 for pulling the frame plate 4 out. If it is pushed in a reverse direction, then it is positioned again. This design is beneficial for installing a new fan or updating a fan. Therefore, for a long period operational computer, the maintenance and exception processes can be performed without needing to turn of the power.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An extracted and positioning device of a fan, comprising: a frame of a computer casing being installed with at least one fan fixing frame; the fixing frame is a frame body; each of two sides of the frame body is disposed with a lateral plate; an inner surface of each lateral plate has inward flange; a rear end of each of the lateral plates being connected to a rear plate; a front bottom plate is connected in front of the lateral plate; a buckle with an elastic press is transversely and forwardly protruded from the front bottom plate; further, a slidable frame plate is formed and is engagable with the fixing frame; the slidable frame plate has a 日 shape; the slidable frame plate is slidable with the inward flanges of the frame body; a front end of the frame plate has a pull with a through hole; a concave portion is at a middle portion of the front end of the pull, thereby, as the frame plate slides into the frame body, the frame plate can be positioned by the buckle; each of four corners of the frame plate are connected to the fan; the fan slides on the fixing frame with the frame plate.

2. The extracted and positioning device of a fan as claimed in claim 1, wherein a joint for being connected to a power source is installed on the rear plate of the fixing frame; a protrusion is formed at a rear end of the slidable frame plate for being connected to the joint; power is adapted to be provided from wires on the frame plate, and each of the two sides of the frame body of the fixing frame has an ear piece, the ear piece has a hole therein so as to be threadedly fixed to the frame through the hole.

* * * * *